(12) United States Patent
Hackler, Sr. et al.

(10) Patent No.: US 7,015,547 B2
(45) Date of Patent: Mar. 21, 2006

(54) MULTI-CONFIGURABLE INDEPENDENTLY MULTI-GATED MOSFET

(75) Inventors: Douglas R. Hackler, Sr., Boise, ID (US); Stephen A. Parke, Nampa, ID (US)

(73) Assignee: American Semiconductor, Inc., Boise, ID (US)

(*) Notice: Subject to any disclaimer, the term of this patent is extended or adjusted under 35 U.S.C. 154(b) by 0 days.

(21) Appl. No.: 10/613,169

(22) Filed: Jul. 3, 2003

(65) Prior Publication Data

US 2005/0001319 A1    Jan. 6, 2005

(51) Int. Cl.
*H01L 27/01* (2006.01)
*H01L 27/12* (2006.01)

(52) U.S. Cl. ........................ 257/347; 257/349
(58) Field of Classification Search .............. 257/347, 257/250, 349; 438/157, 176
See application file for complete search history.

(56) References Cited

U.S. PATENT DOCUMENTS

| | | | |
|---|---|---|---|
| 3,755,012 A | 8/1973 | George et al. .............. 148/175 |
| 4,300,064 A | 11/1981 | Eden .......................... 307/446 |
| 4,468,574 A | 8/1984 | Engeler et al. ............. 307/451 |
| 5,273,921 A | 12/1993 | Neudeck et al. ............. 437/41 |
| 5,349,228 A | 9/1994 | Neudeck et al. ............ 257/365 |
| 5,436,506 A | 7/1995 | Kim et al. ................... 257/347 |
| 5,677,550 A | 10/1997 | Lee ............................... 257/69 |
| 5,773,331 A | 6/1998 | Solomon et al. ............. 438/164 |
| 6,064,589 A | 5/2000 | Walker ......................... 365/149 |
| 6,072,354 A | 6/2000 | Tachibana et al. ........... 327/390 |
| 6,097,221 A | 8/2000 | Sako ........................... 326/113 |
| 6,104,068 A | 8/2000 | Forbes ........................ 257/365 |
| 6,188,243 B1 | 2/2001 | Liu et al. ...................... 326/81 |
| 6,248,626 B1 * | 6/2001 | Kumar et al. ................ 438/257 |
| 6,365,465 B1 | 4/2002 | Chan et al. .................. 438/283 |
| 6,376,317 B1 | 4/2002 | Forbes et al. ................ 438/283 |
| 6,404,237 B1 | 6/2002 | Mathew et al. ............. 326/113 |
| 6,420,905 B1 | 7/2002 | Davis et al. ................. 326/113 |
| 6,433,609 B1 | 8/2002 | Voldman ..................... 327/313 |
| 6,472,258 B1 | 10/2002 | Adkisson et al. ............ 438/192 |
| 6,483,156 B1 | 11/2002 | Adkisson et al. ............ 257/401 |
| 6,506,638 B1 | 1/2003 | Yu ............................... 438/156 |
| 6,518,127 B1 | 2/2003 | Hshieh et al. ............... 438/270 |
| 6,580,137 B1 | 6/2003 | Parke .......................... 257/401 |
| 2001/0022521 A1 | 9/2001 | Satsaki et al. ............... 326/113 |

(Continued)

OTHER PUBLICATIONS

Harada et al., "2-GHz RF Front-End Circuits in CMOS/SIMOX Operating at an Extremely Low Voltage of 0.5 V," IEEE Journal of Solid-State Circuits, vol. 35, No. 12, Dec. 2000, pp. 2000-2004.

(Continued)

*Primary Examiner*—Phat X. Cao
(74) *Attorney, Agent, or Firm*—John R. Thompson; Stoel Rives LLP

(57) ABSTRACT

A double-gated transistor architecture provides a four terminal device for independent gate control, a floating body device, and a dynamic threshold device. The channel may have a U-shaped cross-sectional area to increase the channel length and gate control. First and second insulating spacers are disposed on opposing sides of the top gate such that the first spacer is between the source and the top gate and the second spacer is between the drain and the top gate. The source and drain include extensions that extend proximate to the spacers and couple to the channel. The spacers shield the channel from the field effect of the source and drain and further resist compression of the channel by the source and drain.

39 Claims, 12 Drawing Sheets

U.S. PATENT DOCUMENTS

| | | | |
|---|---|---|---|
| 2002/0047727 A1 | 4/2002 | Mizuno | 326/113 |
| 2002/0081808 A1 | 6/2002 | Forbes | 438/283 |
| 2002/0084803 A1 | 7/2002 | Mathew et al. | 326/113 |
| 2002/0093053 A1 | 7/2002 | Chan et al. | 257/347 |
| 2002/0105039 A1 | 8/2002 | Hanafi et al. | 257/401 |
| 2002/0140039 A1 | 10/2002 | Adkisson et al. | 257/377 |
| 2002/0153587 A1 | 10/2002 | Adkisson et al. | 257/510 |
| 2002/0180486 A1 | 12/2002 | Yamashita et al. | 326/113 |
| 2002/0187610 A1 | 12/2002 | Furukawa et al. | 438/283 |
| 2003/0058001 A1 | 3/2003 | Boerstler et al. | 326/113 |
| 2003/0089930 A1 | 5/2003 | Zhao | 257/256 |

OTHER PUBLICATIONS

Wann et al., "CMOS with Active Well Bias for Low-Power and RF/Analog Applications," 2000 Symposium on VLSI Technology Digest of Technical Papers, 2 pgs.

Yang et al., "Back-Gated CMOS on SOIAS for Dynamic Threshold Voltage Control," IEEE Transactions on Electron Devices, vol. 44, No. 5, May 1997, pp. 822-831.

Assaderaghi et al., "Dynamic Threshold-Voltage MOSFET (DTMOS) for Ultra-Low Voltage VLSI," IEEE Transactions on Electron Devices, vol. 44, No. 3, Mar. 1997, pp. 414-422.

Assaderaghi et al., "A Dynamic Threshold Voltage MOSFET (DTMOS) for Very Low Voltage Operation," IEEE Electron Device Letters, vol. 15, No. 12, Dec. 1994, pp. 510-512.

Assaderaghi et al., "A Dynamic Threshold Voltage MOSFET (DTMOS) for Ultra-Low Voltage Operation," Department of Electrical Engineering and Computer Science, University of California at Berkeley, Berkeley, CA, pp. 33.1.1-33.1.4.

Hsu et al., "Low-Frequency Noise Properties of Dynamic-Threshold (DT) MOSFET's," IEEE Electron Device Letters, vol. 20, No. 10, Oct. 1999, pp. 532-534.

Wong H.-S. Philip, "Field Effect Transistors—From Silicon MOSFETS to Carbon Nanotube FETs," Proc. 23$^{rd}$ International Conference on Microelectronics (Miel 2002), vol. 1, NIS, Yugoslavia, May 12-15, 2002, pp. 103-107.

Brown et al., "Intrinsic Fluctuations in Sub 10-nm Double-Gate MOSFETs Introduced by Discreteness of Charge and Matter," IEEE Transactions on Nanotechnology, vol. 1, No. 4, Dec. 2002, pp. 195-200.

Denton et al., "Fully Depleted Dual-Gated Thin-Film SOI P-MOSFET's Fabricated in SOI Islands with an Isolated Buried Polysilicon Backgate," IEEE Electron Device Letters, vol. 17, No. 11, Nov. 1996, pp. 509-511.

Doris et al., "Extreme Scaling with Ultra-Thin Si Channel MOSFET's," IBM Semiconductor Research and Development Center (SRDC), Microelectronics Division, Hopewell Junction, NY 12533, pp. 10.6.1-10.6.4.

Choi et al., "Nanoscale Ultrathin Body PMOSFETs With Raised Selective Germanium Source/Drain," IEEE Electron Device Letters, vol. 22, No. 9, Sep. 2001, pp. 447-448.

Uchida et al., "Experimental Evidences of Quantum-Mechanical Effects on Low-field Mobility, Gate-channel Capacitance, and Threshold Voltage of Ultrathin Body SOI MOSFETs," Advanced LSI Technology Laboratory, Toshiba Corp., 8 Shinsugita-cho, Isogo-ku Yokohama 235-8522, Japan, pp. 29.4.1-29.4.4.

Ren et al., "An Experimental Study on Transport Issues and Electrostatics of Ultrathin Body SOI pMOSFETs," IEEE Electron Device Letters, vol. 23, No. 10, Oct. 2002, pp. 609-611.

Colinge et al., "Silicon-On-Insulator 'Gate-All-Around Device'," IMEC, Kapeldreef 75, 3030 Leuven, Belgium, pp. 25.4.1-25.4.4.

Hergenrother et al., "50 nm Vertical Replacement-Gate (VRG) nMOSFETs with ALD $HfO_2$ and $Al_2O_3$ Gate Dielectrics," Agere Systems, Murray Hill, NJ 07974, USA, pp. 3.1.1-3.1.4.

Hokazono et al., "14 nm Gate Length CMOSFETs Utilizing Low Thermal Budget Process with Poly-SiGe and Ni Salicide," SoC Research & Development Center, Process & Manufacturing Engineering Center, [2]System LSI Division, Toshiba Corporation Semiconductor Company, 8 Shinsugita-cho, Isogo-ku, Yokohama, Kanagawa 235-8522, Japan, pp. 27.1.1-27.1.4.

Schulz et al., "50-nm Vertical Sidewall Transistors With High Channel Doping Concentrations," Infineon Technologies AG, Corporate Research, D-81730 Munich, Germany, pp. 3.5.1-3.5.4.

Fung et al., "Gate length scaling accelerated to 30nm regime using ultra-thin film PD-SOI Technology," IBM Microelectronics Semiconductor Research and Development Center (SRDC), pp. 29.3.1-29.3.4.

Narasimha et al., "High Performance Sub-40nm CMOS Devices on SOI for the 70nm Technology Node," IBM Microelectronics Semiconductor Research and Development Center (SRDC), Hopewell Junction, NY 12533, USA, pp. 29.2.1-29.2.4.

Hisamoto, Digh, "FD/DG-SOI MOSFET—a viable approach to overcoming the device scaling limit," Central Research Laboratory, Hitachi Ltd., Kokubunji, Tokyo 185-8601, Japan, pp. 19.3.1-19.3.4.

Kedzierski et al., "Complementary silicide source/drain thin-body MOSFETs for the 20nm gate length regime," Department of Electrical Engineering and Computer Sciences, University of California at Berkeley, Berkeley, CA, 94720, USA, pp. 3.4.1-3.4.4.

Oh et al., "50 nm Vertical Replacement-Gate (VRG) pMOSFETs," Bell Laboratories, Lucent Technologies, Murray Hill, NJ 07974, USA, pp. 3.6.1-3.6.4.

Pidin et al., "A Notched Metal Gate MOSFET for sub-0.1 $\mu$m Operation," Fujitsu Laboratories Ltd., 10-1 Morinosato-Wakamiya, Atsugi 243-0197, Japan, pp. 29.1.1-29.1.4.

Tavel et al., "High Performance 40nm nMOSFETs With $HfO_2$ Gate Dielectric and Polysilicon Damascene Gate," France Telecom R&D, B.P. 98, 38243 Meylan, France, pp. 17.1.1-17.1.4.

Krivokapic et al., "Nickel Silicide Metal Gate FDSOI Devices with Improved Gate Oxide Leakage," AMD, Technology Research Group, M/S 143, One AMD Place, Sunnyvale, CA 94088-3453, USA, pp. 10.7.1-10.7.4.

Monfray et al., "SON (Silicon-On-Nothing) P-MOSFETs with totally silicided ($CoSi_2$) Polysilicon on 5nm-thick Si-films: The simplest way to integration of Metal Gates on thin FD channels," ST Microelectronics, 850, rue J.Monnet, 38921 Crolles, France, pp. 10.5.1-10.5.4.

Yang et al., "25 nm CMOS Omega FETs," Taiwan Semiconductor Manufacturing Company, No. 6, Li-Hsin Rd. 6, Science-Based Industrial Park, Hsin-Chu, Taiwan, ROC, pp. 10.3.1-10.3.4.

Wong et al., "Design and Performance Considerations for Sub-0.1 $\mu m$ Double-Gate SOI MOSFET's," I.B.M. Thomas J. Watson Research Center, P.O. Box 218, Yorktown Heights, New York 10598, U.S.A., pp. 30.6.1-30.6.4.

Wong et al., "Device Design Considerations for Double-Gate, Ground-Plane, and Single-Gated Ultra-Thin SOI MOSFET's at the 25 nm Channel Length Generation," IBM T.J. Watson Research Center, P.O. Box 218, Yorktown Heights, New York 10598, U.S.A., pp. 15.2.1-15.2.4.

Guarini et al., "Triple-Self-Aligned, Planar Double-Gate MOSFETs: Devices and Circuits," IBM T.J. Watson Research Center, Yorktown Heights, New York 10598, U.S.A., pp. 19.2.1-19.2.4.

Solomon et al., "Two Gates Are Better Than One," IEEE Circuits & Devices Magazine, Jan. 2003, pp. 48-63.

Cheng et al., "The Impact of High-κ Gate Dielectrics and Metal Gate Electrodes on Sub-100 nm MOSFET's," IEEE Transactions on Electron Devices, vol. 46, No. 7, Jul. 1999, pp. 1537-1544.

Oh et al., "Analytic Description of Short-Channel Effects in Fully-Depleted Double-Gate and Cylindrical, Surrounding-Gate MOSFETs," IEEE Electron Device Letters, vol. 21, No. 9, Sep. 2000, pp. 445-447.

Ieong et al., "High Performance Double-Gate Device Technology Challenges and Opportunities," IBM Microelectronics Semiconductor Research and Development Center (SRDC), Hopewell Junction, NY, USA, pp. 492-495.

Chang et al., "Gate Length Scaling and Threshold Voltage Control of Double-Gate MOSFETs," Department of Electrical Engineering and Computer Sciences, University of California, Berkeley, CA 94720, USA, pp. 31.2.1-31.2.4.

Wong et al., "Self-Aligned (Top and Bottom) Double-Gate MOSFET with a 25 nm Thick Silicon Channel," IBM T.J. Watson Research Center, P.O. Box 218, Yorktown Heights, New York 10598, U.S.A., pp. 16.6.1-16.6.4.

Yagishita et al., "*Dynamic Threshold Voltage Damascene Metal Gate MOSFET* (DT-DMG-MOS) with Low Threshold Voltage, High Drive Current, and Uniform Electrical Characteristics," Process & Manufacturing Engineering Center, Semiconductor Company, Toshiba Corporation, 8, Shinsugita-cho, Isogo-ku, Yokohama 235-8522, Japan, pp. 29.2.1-29.2.4.

Samavedam et al., "Dual-Metal Gate CMOS with HfO$_2$ Gate Dielectric," Motorola Digital DNA ™ Laboratories, 3501 Ed Bluestein Blvd., MD:K10, (*AMD), Austin, TX 78721, USA, pp. 17.2.1-17.2.4.

Fossum et al., "Speed Superiority of Scaled Double-Gate CMOS," IEEE Transactions on Electron Devices, vol. 49, No. 5, May 2002, pp. 808, 809, 811.

Lee et al., "Super Self-Aligned Double-Gate (SSDG) MOSFETs Utilizing Oxidation Rate Difference and Selective Epitaxy," Microsystems Technology Laboratories, Massachusetts Institute of Technology, Cambridge, MA, USA, pp. 3.5.1-3.5.4.

Polishchuk et al., "Dual Work Function Metal Gate CMOS Technology Using Metal Interdiffusion," IEEE Electron Device Letters, vol. 22, No. 9, Sep. 2001, pp. 444-446.

Yeo et al., "Dual-Metal Gate CMOS Technology with Ultrathin Silicon Nitride Gate Dielectric," IEEE Electron Device Letters, vol. 22, No. 5, May 2001, pp. 227-229.

Wakabayashi et al., "A Dual-Metal Gate CMOS Technology Using Nitrogen-Concentration-Controlled TiNx Film," IEEE Transactions on Electron Devices, vol. 48, No. 10, Oct. 2001, pp. 2363-2369.

Yagishita et al., "*Dynamic Threshold Voltage Damascene Metal Gate MOSFET* (DT-DMG-MOS) Technology for Very Low Voltage, Operation of Under 0.7 V," IEEE Transactions on Electron Devices, vol. 49, No. 3, Mar. 2002, pp. 422-428.

Matsuo et al., "High Performance Damascene Gate CMOSFETs with Recessed Channel Formed by Plasma Oxidation and Etching Method (RC-POEM)," Process & Manufacturing Engineering Center, Semiconductor Company, Toshiba Corporation, 8, Shinsugita-cho, Isogo-ku, Yokohama 235-8522, Japan, pp. 17.5.1-17.5.4.

Ducroquet et al., "Full CMP Integration of CVD TiN Damascene Sub-0.1-μm Metal Gate Devices for ULSI Applications," IEEE Transactions on Electron Devices, vol. 48, No. 8, Aug. 2001, pp. 1816-1821.

Choi et al., "Nanoscale CMOS Spacer FinFET for the Terabit Era," IEEE Electron Device Letters, vol. 23, No. 1, Jan. 2002, pp. 25-27.

Lindert et al., "Sub-60-nm Quasi-Planar FinFETs Fabricated Using a Simplified Process," IEEE Electron Device Letters, vol. 22, No. 10, Oct. 2001, pp. 487-489.

Choi et al., "A Spacer Patterning Technology for Nanoscale CMOS," IEEE Transactions on Electron Devices, vol. 49, No. 3, Mar. 2002, pp. 436-441.

Li et al., "Damascene W/TiN Gate MOSFETs With Improved Performance for 0.1-μm Regime," IEEE Transactions on Electron Devices, vol. 49, No. 11, Nov. 2002, pp. 1891-1896.

Huang et al., "Sub-50 nm P-Channel FinFET," IEEE Transactions on Electron Devices, vol. 48, No. 5, May 2001, pp. 880-886.

Pei et al., "FinFET Design Considerations Based on 3-D Simulation and Analytical Modeling," IEEE Transactions on Electron Devices, vol. 49, No. 8, Aug. 2002, pp. 1411-1419.

Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

Chang et al., "FinFET Scaling to 10nm Gate Length," Strategic Technology, Advanced Micro Devices, Inc., Sunnyvale, CA 94088, USA, pp. 10.2.1-10.2.4.

Choi et al., "FinFET Process Refinements for Improved Mobility and Gate Work Function Engineering," Department of Electrical Engineering and Computer Sciences, University of California, Berkeley, CA 94720, USA, pp. 10.4.1-10.4.4.

Lindert et al., "Sub-60-nm Quasi-Planar FinFETs Fabricated Using a Simplified Process," IEEE Electron Device Letters, vol. 22, No. 10 Oct. 2001, pp. 487-489.

Huang et al., "Sub 50-nm FinFET: PMOS," Department of Electrical Engineering and Computer Sciences, University of California at Berkeley, CA 94720, USA, pp. 3.4.1-3.4.4.

Choi et al., "Sub-20nm CMOS FinFET Technologies," Department of Electrical Engineering and Computer Sciences, University of California, Berkeley, CA 94720, USA, pp. 19.1.1-19.1.4.

Kedzierski et al., "Metal-gate FinFET and fully-depleted SOI devices using total gate silicidation," IBM Semiconductor Research and Development Center (SRDC), Research Division, T J Watson Research Center, Yorktown Heights, NY 10598, pp. 10.1.1-10.1.4.

Lin et al., "High-Performance P-Channel Schottky-Barrier SOI FinFET Featuring Self-Aligned PtSi Source/Drain and Electrical Junctions," IEEE Electron Device Letters, vol. 24, No. 2, Feb. 2003, pp. 102-104.

Lee et al., "Hydrogen Annealing Effect on DC and Low-Frequency Noise Characteristics in CMOS FinFETs," IEEE Electron Device Letters, vol. 24, No. 3, Mar. 2003, pp. 186-188.

Yagishita et al., "High Performance Metal Gate MOSFETs Fabricated by CMP for 0.1 μm Regime," Microelectronics Engineering Laboratory, Toshiba Corporation, 8, Shinsugita-cho, Isogo-ku, Yokohama 235-8522, Japan, pp. 29.3.1-29.3.4.

Yagishita et al., "Improvement of Threshold Voltage Deviation in Damascene Metal Gate Transistors," IEEE Transactions on Electron Devices, vol. 48, No. 8, Aug. 2001, pp. 1604-1611.

Yahishita et al., "High Performance Damascene Metal Gate MOSFET's for 0.1 μm Regime," IEEE Transactions on Electron Devices, vol. 47, No. 5, May 2000, pp. 1028-1034.

Kimura et al., "Short-Channel-Effect-Suppressed Sub-0.1-μm Grooved-Gate MOSFET's with W Gate," IEEE Transactions on Electron Devices, vol. 42, No. 1, Jan. 1995, pp. 94-100.

Tanaka et al., "Simulation of Sub-0.1-μm MOSFET's with Completely Suppressed Short-Channel Effect," IEEE Electron Device Letters, vol. 14, No. 8, Aug. 1993, pp. 396-399.

Tanaka et al., "A Sub-0.1-μm Grooved Gate MOSFET with High Immunity to Short-Channel Effects," Central Research Laboratory, Hitachi, Ltd., 1-280 Higashi-koigakubo, Kokubunji, Tokyo 185, Japan, pp. 21.1.1-21.1.4.

Sunouchi et al., "Double LDD Concave (DLC) Structure for Sub-Half Micron MOSFET," ULSI Research Center, Toshiba Corporation, 1, Komukai, Saiwai-ku, Kawasaki 210, Japan, pp. 226-228.

Hackler, Sr., Douglas R., "TMOS: A Novel Design for MOSFET Technology," A Thesis Presented in Partial Fulfillment of the Requirements for the Degree of Master of Science with a Major in Electrical Engineering in the College of Graduate Studies, University of Idaho, Oct. 1999, 126 pgs.

* cited by examiner

MULTI-CONFIGURABLE INDEPENDENTLY MULTI-GATED MOSFET

TECHNICAL FIELD

The present invention relates to the composition and manufacture of metal oxide semiconductor field effect transistors (MOSFET).

BACKGROUND OF THE INVENTION

The MOSFET is a voltage controlled semiconductor device with an input gate voltage controlling an output current. The MOSFET is an effective semiconductor device in applications ranging from high-speed digital logic to low voltage current analog and RF circuits. The MOSFET has very high input impedance and is capable of amplifying very low current signals. MOSFETs are found in virtually every application of microelectronics and integrated circuits.

A MOSFET may be configured as a three electrode device with a drain, a source, and a gate electrode, or as a multi-electrode device where two or more gate electrodes are incorporated to provide a multi-gated device. A semiconducting channel couples to drain and source electrodes and gate voltages control the electron flow through the channel to provide current amplification and switching capability.

A key concern in consumer electronics is being able to generate smaller devices that consume less power. Although significant progress has been made in this area, a common problem is gate voltage control of the channel as the device decreases in size. Gate voltage control is achieved by exerting a field effect on the channel. As the transistor size decreases, short-channel effects become more problematic and interfere with the gate voltage's ability to provide exclusive channel control. Ideally, total control of the channel should rest with the gate voltage.

In transistor architecture it is advantageous to further have the ability to provide different electrical configurations and threshold voltages based on intended applications. Typically, this is achieved with additional process complexity that requires more masks and threshold implants. It would be advantageous to achieve multiple configurations by manipulating the connections of the device, resulting in different design parameters. Fabrication would be greatly simplified if various electrical behaviors could be achieved by simply modifying the connections. It would further be advantageous to provide such configurations without a layout area penalty.

Thus, it would be an advancement in the art to provide a transistor architecture with multiple, independent gate control and flexibility in providing multiple electrical configurations. Such a device is disclosed and claimed herein.

SUMMARY OF THE INVENTION

The present invention provides a multi-gated transistor architecture that offers a multi-terminal device for independent gate control, a bipolar lateral transistor, and a dynamic threshold MOSFET. By simple manipulation of the gate and local interconnect masks the terminal connections are adjusted to provide different devices.

The architecture includes a bottom gate that may be formed of crystalline silicon and is disposed on a substrate. The source, channel, and drain are disposed above the bottom gate to provide a carrier flow controlled by the bottom gate voltage. In one embodiment, the channel may have a U-shaped cross-section to increase the channel length and gate control. A gate dielectric insulator is disposed on the channel with a top gate disposed on the channel. Insulating spacers are disposed on opposing sides of the top gate such that a first spacer is between the source and the top gate and a spacer is between the drain and the top gate. The transistor is completely surrounded by sidewall spacers, a buried dielectric layer, and a dielectric cap layer to provide full three-dimensional isolation.

The source includes a source extension that extends proximate to the first spacer and couples to the channel. Similarly, the drain includes a drain extension that extends proximate to the second spacer and couples to the channel. The spacers shield the channel from the field effect of the source and drain and provide a sublithographic channel length.

The unique transistor architecture has flexible terminal connection design and superior gate control. The transistors produced in accordance with the present invention have improved electron flow over conventional designs. Additional aspects and advantages of this invention will be apparent from the following detailed description of preferred embodiments, which proceeds with reference to the accompanying drawings.

BRIEF DESCRIPTION OF THE DRAWINGS

A more particular description of the invention briefly described above will be rendered by reference to the appended drawings. Understanding that these drawings only provide information concerning typical embodiments of the invention and are not therefore to be considered limiting of its scope, the invention will be described and explained with additional specificity and detail through the use of the accompanying drawings, in which.

DETAILED DESCRIPTION OF PREFERRED EMBODIMENTS

Figure 1:
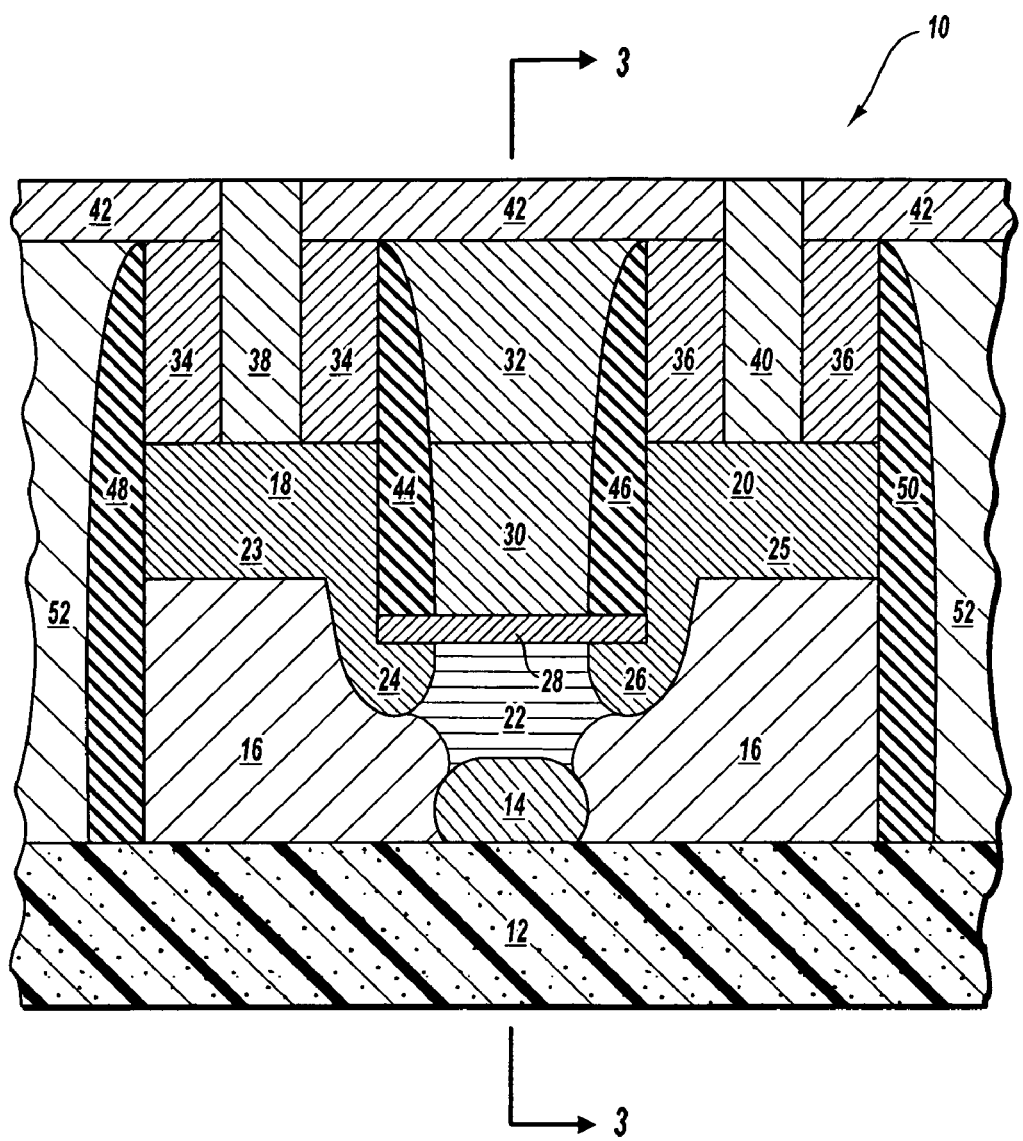
FIG. 1 is a cross-sectional view of an embodiment of a transistor of the present invention.

Reference is now made to the figures in which like reference numerals refer to like elements. For clarity, the first digit or digits of a reference numeral indicates the figure number in which the corresponding element is first used.

Throughout the specification, reference to "one embodiment" or "an embodiment" means that a particular described feature, structure, or characteristic is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the invention.

Referring to FIG. 1 a cross-sectional view of one embodiment of the double-gated transistor 10 of the present invention is shown. The illustrated transistor 10 discussed herein is an N-channel device, but may as well be embodied as a P-channel device as can be appreciated by one of skill in the art. The transistor 10 includes a substrate 12 that may be formed of any number of suitable materials. The substrate 12 may include silicon and a buried insulator such as silicon dioxide which is commonly referred to as a buried oxide layer.

A bottom gate 14 is disposed on the substrate 12 and includes a low resistance doped silicon material. The bottom gate 14 is highly doped, such as by ion implantation, to create a P+ bottom gate in the N-channel configuration. The transistor 10 includes a high-resistivity silicon on insulator (SOI) layer 16 that is preferably a P-type material. The SOI layer 16 may be formed by any number of available methods including SmartCut bonded, SIMOX, metal-induced polyrecrystallization, and so forth.

The source 18, drain 20, and channel 22 form a current flow path in accordance with MOSFET practice. The source 18 and drain 20 may be formed of any suitable N+ materials in an N-channel configuration. Formation of the source 18 and drain 20 may include deposition of an additional material layer or doping of the existing dielectric layer 16.

In a depletion type MOSFET, the channel 22 may include a layer of material that is the same as the source 18 and drain 20, such as an N-type material in the given example. The gate voltage can reduce the channel current by depleting carriers or increase the channel current by increasing carriers. In an enhancement type MOSFET, the channel 22 is an area extending into the P-type material of the dielectric layer 16. Application of a positive gate voltage pushes away the holes in the P-type material and attracts the moveable electrons in the N-type source 18 and drain 20 to form a channel 22. In FIG. 1, the channel 22 is defined as the area between the source 18, drain 20, bottom gate 14, and gate dielectric insulator 28. The channel 22 may therefore be an undoped region of the dielectric layer 16. As can be appreciated, the present invention is applicable to either depletion or enhancement type MOSFETs.

The source 18 includes a main body 23 that represents the majority of the source 18 and a source extension 24 that extends from the main body 23 to couple with the channel 22. The source extension 24 has significantly less cross-sectional area than the main body 23. Similarly, the drain 20 includes a main body 25, that is the majority of the drain 20, and a drain extension 26 that extends from the main body 25 and couples to the channel to enable electron flow. The drain extension 26 has significantly less cross-sectional area than the main body 25.

The extensions 24, 26 increase the distance of the main bodies 23, 25 from the channel 22 to reduce the short-channel effect created by the drain 20. However, in reducing the short-channel effect a resistance is created in the extensions 24, 26. This is acceptable given the superior gate control enabled by the reduced field effect. The extensions 24, 26 may be configured in various shapes in coupling to the main bodies 23, 25 to the channel 22.

A gate dielectric insulator 28 is disposed on the channel 22 and a top gate 30 is disposed on the gate dielectric insulator layer 28. The gate dielectric insulator 28 is a dielectric, such as silicon dioxide, that insulates the top gate 30 from the channel 22 as is well known in MOSFET architecture. The top gate 30 may be formed of any suitable metallic material such as Mo, W, Al, or TiN. A local interconnect 32 is disposed on the top gate 30 and may include any number of various materials including Al.

The transistor 10 further includes polish stop pad layers 34, 36 that are disposed on the source 18 and drain 20 respectively. The pad layers 34, 36 are formed of a dielectric material. Extending through each pad layer 34, 36 are one or more contact layers 38, 40 that couple to a respective source 18 and drain 20. An interlevel dielectric (ILD) layer 42 is disposed on the pad layer 34, 36 and also has the contact layers 38, 40 extending through to enable contact.

First and second spacers 44, 46 are disposed within to prevent contact between the top gate 30 and the source 18 and drain 20 as shown. The spacers may include any number of insulating materials such as silicon nitride or silicon oxide. The spacers 44, 46 further extend to prevent contact between the local interconnect 32 and the source and drain 18, 20.

As illustrated, the majority of the source 18 and drain 20 is disposed on one side of a corresponding spacer 44, 46. The source and drain extensions 24, 26 extend proximate to the spacers 44, 46 and couple to the channel 22. The disposition of the spacers 44, 46 and the extensions 24, 26 shield the channel 22 from the field effect of the source and drain 18, 20 while still providing contact to enable electron flow. As transistor size is reduced, the source and drain voltages interfere with the gate voltage and inhibit gate control of the channel 22. The present invention provides improved gate control of the channel 22 by limiting the field effect and capacitance of drain 20 voltages.

In one implementation, the pads 34, 36 include a different dielectric material than that of the spacers 44, 46. Thus, if the spacers 44, 46 are formed of a silicon nitride then the pads 34, 36 are formed of silicon oxide. Conversely, if the pads 34, 36 include a silicon nitride, then the spacers 44, 46 include silicon oxide.

The transistor 10 further includes third and fourth spacers 48, 50, formed of the same insulating material of the first and second spacers 44, 46. The third and fourth spacers 48, 50 extend vertically along the peripheral edges of the transistor 10. The spacers 48, 50 serve to isolate the transistors 10 from each other and provide radiation resistance and may be referred to as exterior spacers. As can be appreciated, the spacers 48, 50 may extend, alone or in conjunction with other spacers, to surround the components of the transistor 10. An insulating layer 52, such as a STI oxide, may further be disposed around the transistor 10 to provide further isolation. The transistor 10 is encapsulated within the insulating layer 52, spacers 48, 50, and ILD layer 42 to optimize performance.

The transistor architecture of the present invention provides a four-terminal device that allows the source 18, drain 20, bottom gate 14, and top gate 30 to be biased independently. The bottom gate 14 and the top gate 30 may be wired out to the left or right based on design constraints. Additional conducting and dielectric layers may be disposed on the transistor 10 based on design configurations.

Figure 2:
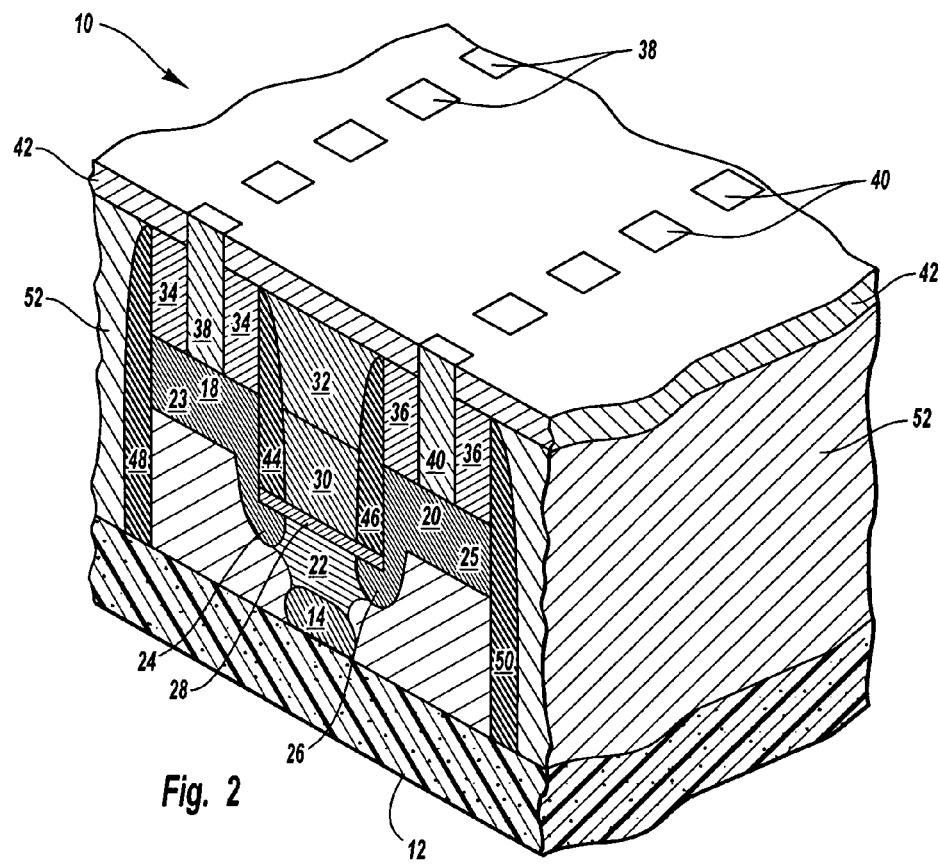
FIG. 2 is an isometric view of the transistor of FIG. 1.

Referring to FIG. 2, an isometric view of the transistor 10 illustrates the upper surface of the ILD layer 42. As shown, the contact layers 38, 40 extend through the ILD layer 42 to enable access to the source 18 and drain 20. The contact layers 38, 40 may provide any number of accesses to the source 18 and drain 20 based on design preferences.

Figure 3:
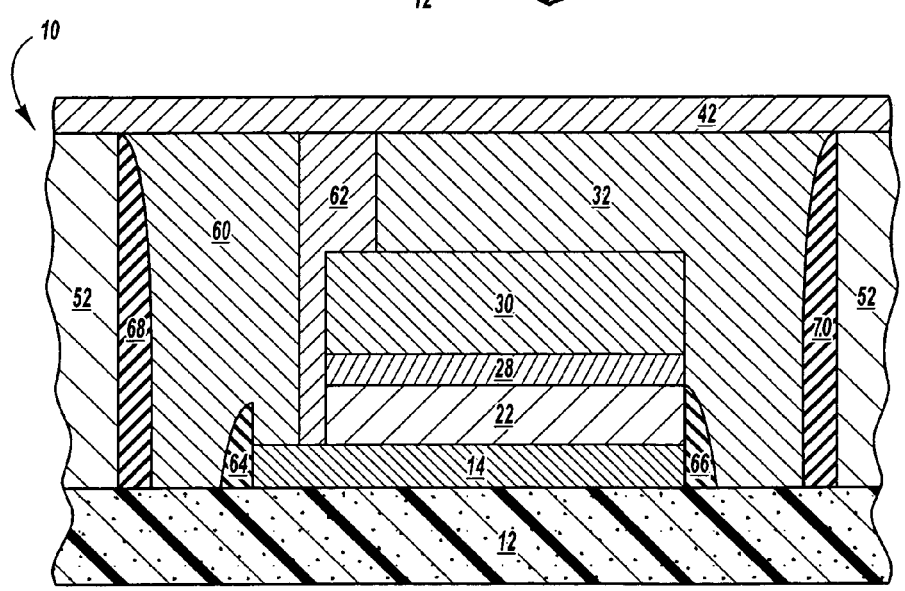
FIG. 3 is a cross-sectional view of the length of the transistor of FIG. 1 along line 3—3.

Referring to FIG. 3, a cross-sectional view of the transistor 10 taken along length 3—3 illustrated in FIG. 1 is shown. The transistor 10 is a four terminal, double-gated device with each gate having an independent bias. The substrate 12, bottom gate 14, channel 22, gate dielectric insulator 28, top gate 30, conducting layer 32, and ILD layer 42 are shown vertically disposed relative to one another. Further shown is a second local interconnect 60 that couples to the bottom gate 14 and provides an independent bias to the bottom gate 14. The second local interconnect 60 is the same material as the first local interconnect 32. The first and second local interconnects 32, 60 together provide the local interconnect for the top and bottom gates 14, 30.

The second local interconnect 60 is separated from the first local interconnect 32 by an STI insulator 62. The insulator 62 may be formed of any suitable material such as an oxide or nitride. In this manner, the top gate 30 and the bottom gate 14 are independently biased. As shown, the top gate 30 is offset relative to the bottom gate 14 to enable separate bias. The offset is accomplished by appropriately positioning the top gate mask along the x-axis during the manufacture process.

Fifth and sixth spacers 64, 66 are disposed adjacent the bottom gate 14 to insulate the bottom gate 14 as needed. In the four terminal device, the sixth spacer 66 separates the bottom gate 14 and the channel 22 from the first local interconnect 32.

Seventh and eighth spacers 68, 70 are disposed to isolate the transistor 10. The spacers 68, 70 may be extensions of the spacers 48, 50 that surround the transistor 10. The insulating layer 52 surrounds and further isolates the transistor 10.

Figure 4:
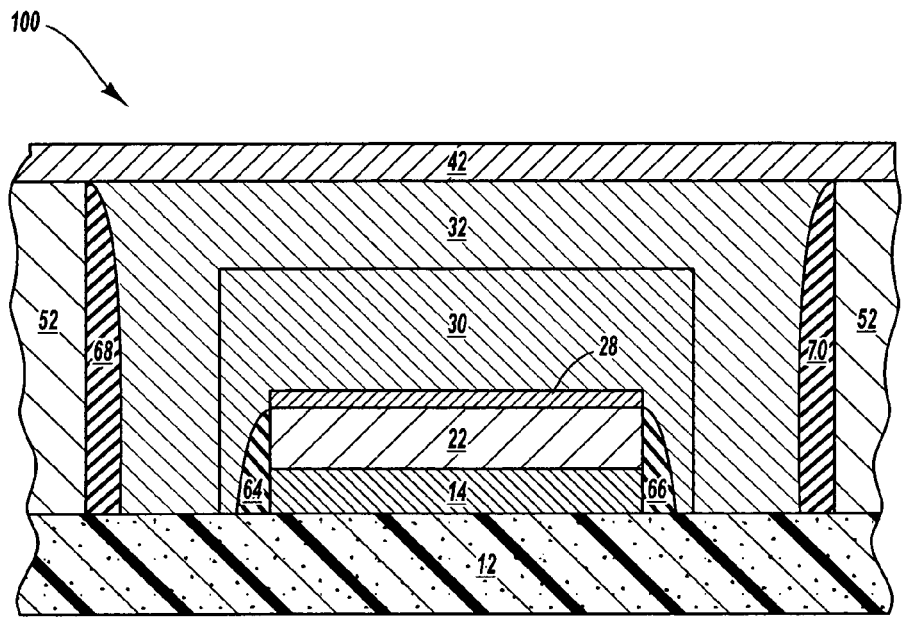
FIG. 4 is a cross-sectional view of the length of an alternative embodiment of a transistor.

Referring to FIG. 4, an alternative embodiment of a transistor 100 is shown wherein the bottom gate 14 is electrically isolated by the spacers 64, 66 and the dielectric layer 16. This embodiment is referenced herein as a lateral bipolar transistor. The top gate 30 extends over the spacers 64, 66 and covers the gate dielectric insulator 28, channel 22, and bottom gate 14. A second local interconnect 60 and an insulator 62 are not required and not present in this embodiment.

In manufacture, a top gate mask is used that extends over a larger area than the bottom gate 14. The top gate 30 and the bottom gate 14 are aligned relative to one another along the x-axis so that the bottom gate 14 is within the perimeter of the top gate 30.

Figure 5:
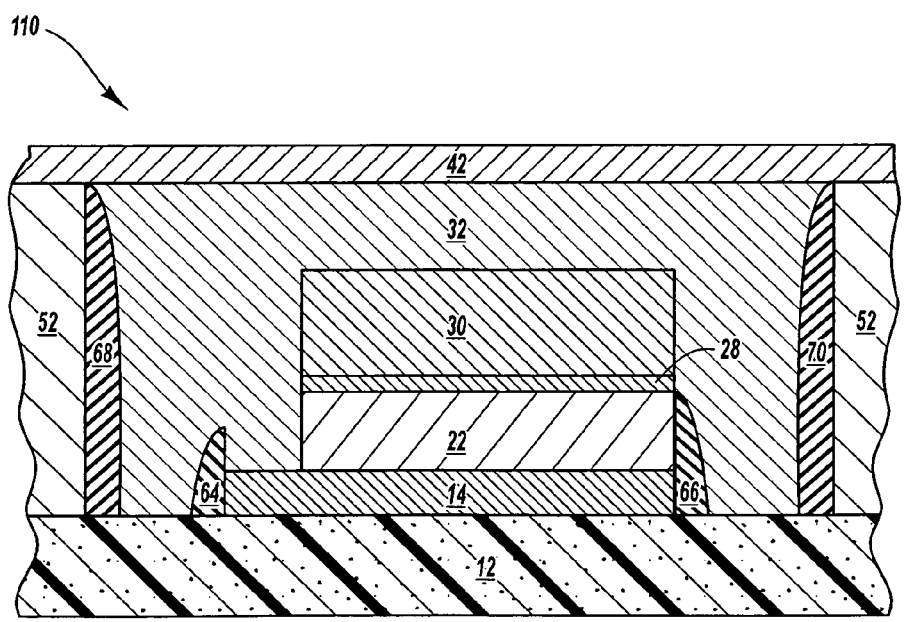
FIG. 5 is a cross-sectional view of the length of an alternative embodiment of a transistor.

Referring to FIG. 5, an alternative embodiment of a transistor 110 of the present invention is shown. The transistor 110 is a dynamic threshold (DTMOS) device wherein the top and bottom gates 14, 30 are shorted to one another. The top gate 30 and the bottom gate 14 are disposed in an offset relationship similar to that of FIG. 3. The transistor 110 does not include a second local interconnect 60 or an insulator 62. Instead, the first local interconnect 32 occupies the space formerly reserved for the second local interconnect 60 and insulator 62 and couples with both the top and bottom gates 14, 30. An advantage of the present invention is that the DTMOS application occupies the same footprint as a three terminal device and incurs no layout penalty.

Positioning the top gate and bottom gate masks in the x-axis relative to one another provides a four terminal device, a lateral bipolar transistor, or a DTMOS MOSFET. As such, the present invention provides a flexible transistor architecture that is adjusted by mask positioning to create different transistor configurations.

Figure 6:
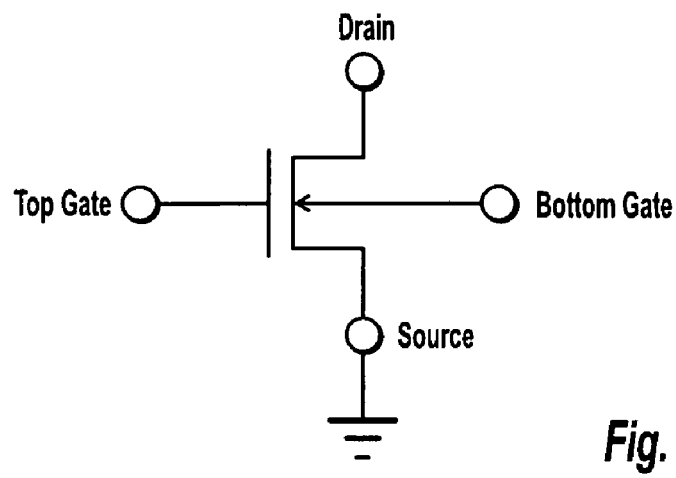
FIG. 6 is a schematic representation of the embodiment of FIG. 3.
Figure 7:
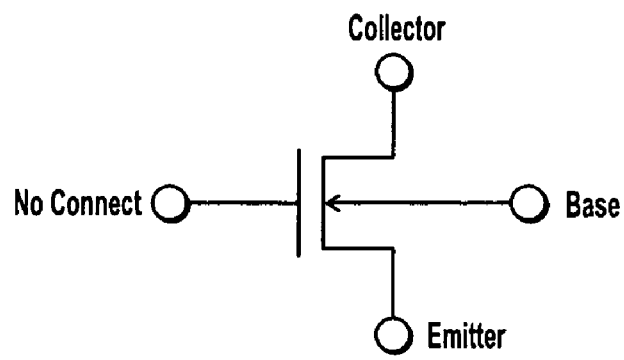
FIG. 7 is a schematic representation of the embodiment of FIG. 4.
Figure 8:
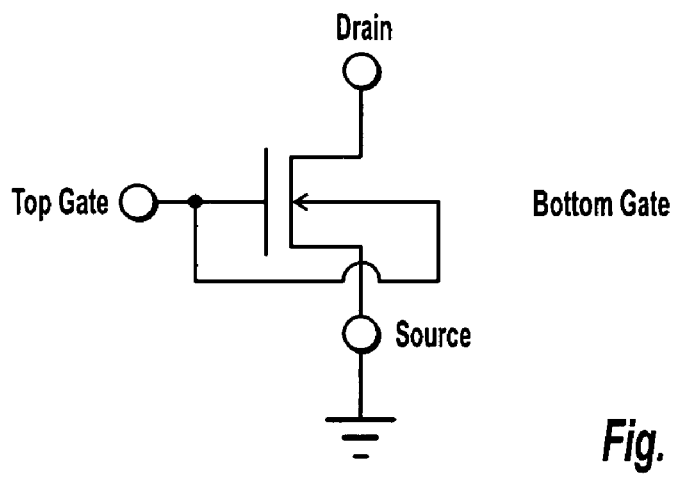
FIG. 8 is a schematic representation of the embodiment of FIG. 5.

Referring to FIGS. 6, 7, and 8, schematic representations of the transistor embodiments corresponding to FIGS. 3, 4, and 5 are shown. FIG. 6 illustrates a four terminal device that provides independent bias to the top gate 30 and the bottom gate 14. FIG. 7 illustrates a lateral bipolar transistor wherein the bottom gate 14 is effectively grounded. FIG. 8 illustrates a DTMOS device wherein the bottom gate 14 and the top gate 30 are shorted to one another. As is well known in the art, each device represented in FIGS. 6-8 has specific uses that are suitable for different applications.

Figure 9:
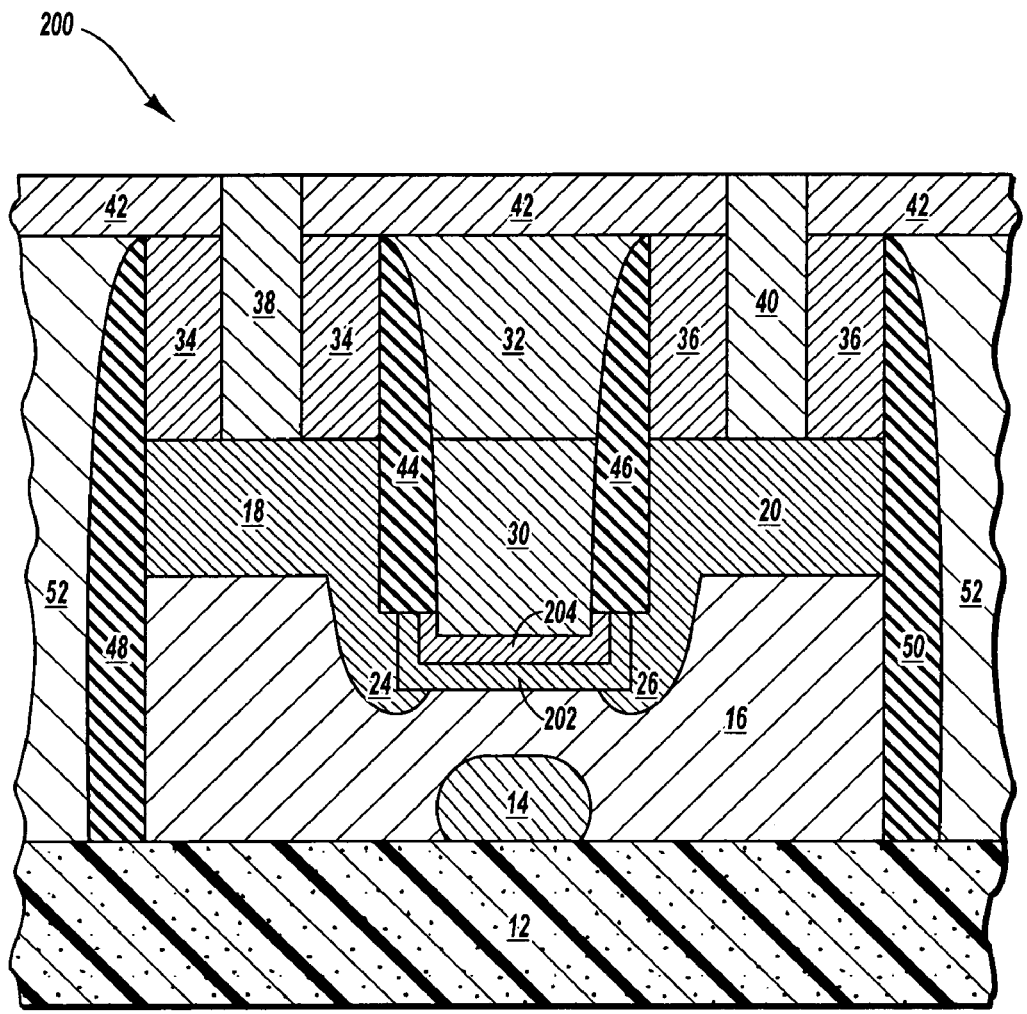
FIG. 9 is a cross-sectional view of an alternative embodiment of a transistor of the present invention.

Referring to FIG. 9, a cross-sectional view of an alternative embodiment of a transistor 200 of the present invention is shown. The transistor 200 is similar to that previously illustrated in FIG. 1 in that the source 18 and drain 20 each include a respective extension 24, 26 coupled to a channel 202. As before, spacers 44, 46 are disposed between the majority of the source 18 and drain 20 and the channel 202 to reduce the field effect on the channel 202.

The channel 202 is U-shaped which increases the channel length and the electron flow path. The increased channel length allows for greater gate control over the channel 202. Thus, the gate control over the channel 202 is significantly improved at the expense of an increased channel length.

A gate dielectric insulator 204 is disposed on the channel 202 and may also be U-shaped as it conforms to the channel 202. Alternatively, the gate dielectric insulator 204 may be shaped in other forms and still be within the scope of the present invention.

Other elements of the transistor 200 operate in a similar fashion to that previously described above. A cross-sectional view of the length of the transistor 200 would be similar to that shown in FIG. 3. As can be appreciated, the view shown in FIG. 3 would be adjusted to account for the position of the channel 202 and gate dielectric insulator 204.

Figure 10:
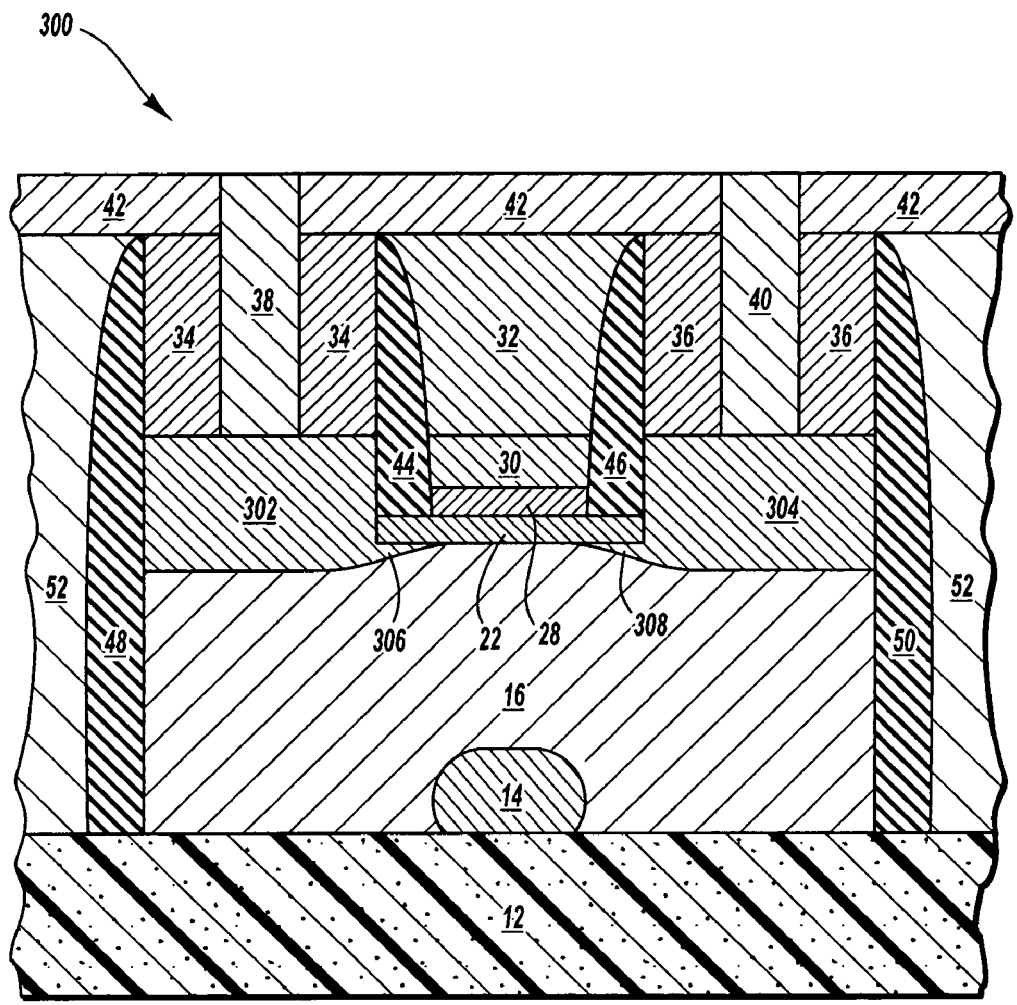
FIG. 10 is a cross-sectional view of an alternative embodiment of a transistor of the present invention.

Referring to FIG. 10, there is shown a cross-sectional view of an alternative embodiment of a transistor 300 of the present invention. As illustrated, the transistor 300 is similar to the embodiment of FIG. 1 and primarily differs in the shape of the source 302, drain 304, and their corresponding extensions 306, 308. The source 302 and drain 304 are vertically aligned closer to the channel 22 than in the previous embodiment. As such, the extensions 306, 308 are shorter and extend primarily in a horizontal direction to couple with the channel 22. The shorter extensions 306, 308 reduce the resistance in the electron flow path.

As in previous embodiments, spacers 44, 46 are disposed between the channel 22 and the majority of the source 302 and drain 304. Accordingly, the channel 22 is partially shielded to reduce the field effect and provide superior gate control.

Figure 11:
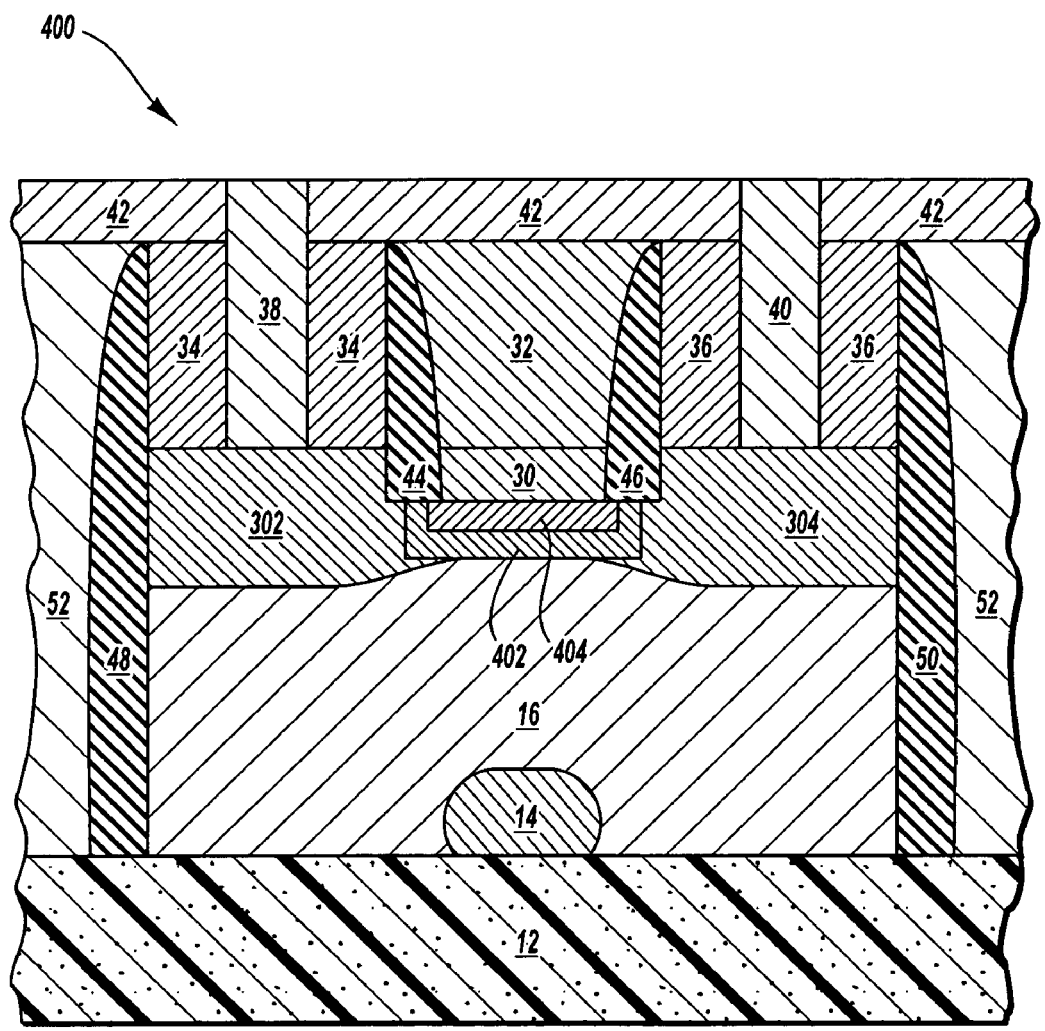
FIG. 11 is a cross-sectional view of an alternative embodiment of a transistor of the present invention.

Referring to FIG. 11, a cross-sectional view of an alternative embodiment of a transistor 400 of the present invention is shown. The transistor 400 is similar to that of FIG. 10 with the primary difference being the shape of the channel 402. The channel 402 is in a U-shape similar to the embodiment of FIG. 9. The increased channel length improves the gate control while increasing the resistance experienced in the flow path. A gate dielectric insulator 404 is disposed on the channel 402 and may have a planar configuration as shown or have a U shape.

Transistors 200, 300, 400 may also be referred to as a configurable transistor in that the alignment of the top gate and bottom gate determines the terminal connections, electrical behavior, and threshold voltage of the device. Thus, the transistors 200, 300, 400 may be embodied as a four terminal device, lateral bipolar transistor, or a DTMOS MOSFET as explained in reference to FIGS. 3 to 8.

Referring to FIGS. 12 to 20, a method for manufacturing the transistor 10 of FIG. 1 is shown. One of skill in the art will appreciate that various processes may be used to create a transistor structure and are included within the scope of the invention. The method described herein is exemplary and is for illustrative purposes only.

Figure 12:
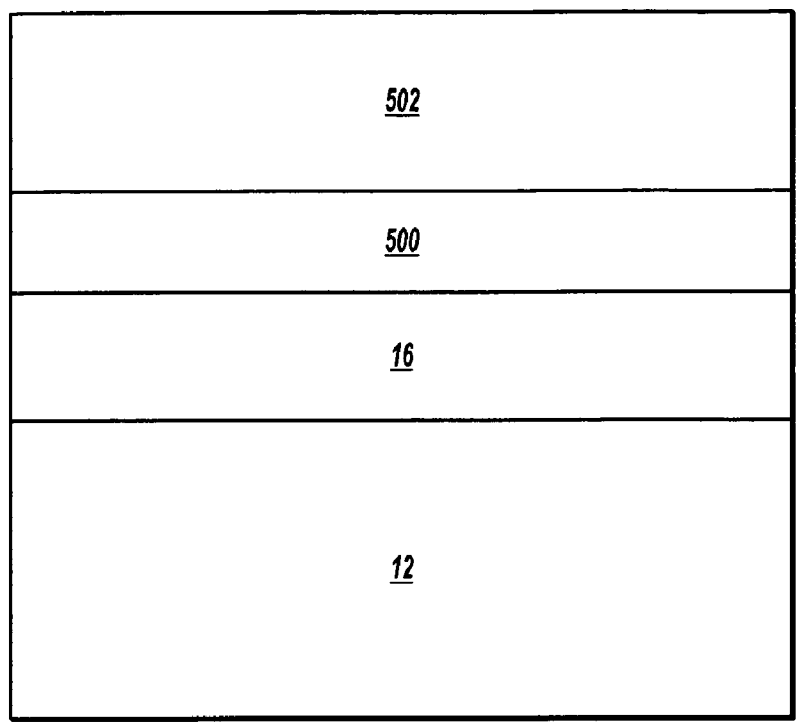
FIG. 12 is a cross-sectional view of layers used in the fabrication of the transistor of FIG. 1.

Referring more specifically to FIG. 12, a cross-sectional view of preliminary layers used in fabrication is shown. The transistor 10 includes a substrate layer 12 that may be formed of any number of resistive materials suitable for the present invention. In one implementation, the substrate 12 may include a lower layer of silicon and a buried oxide layer disposed thereon. A SOI layer 16, such as crystalline silicon, is formed on the substrate layer 12 by any known method. A source/drain layer 500 is formed on the substrate layer 12 and may also include crystalline silicon that is doped with ion implants to form a N+ material. The source/drain layer 500 may be subjected to a metalization step wherein a silicide is applied and removed to improve performance. Typically a silicide such as TiSi, MoSi, or CoSi, is sputtered onto the surface of the source/drain layer 500 and then stripped away to increase electron mobility. A dielectric layer 502 is formed on the source/drain layer 500. The dielectric layer 502 includes either silicon nitride or silicon oxide.

Figure 13:
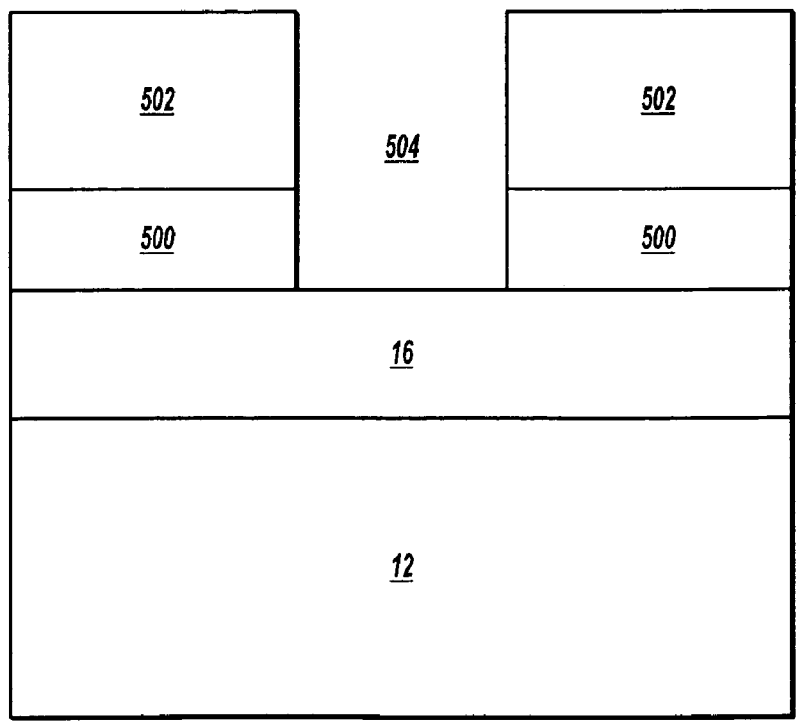
FIG. 13 is a cross-sectional view of the device of FIG. 12 after formation of a trench.

Referring to FIG. 13, a trench is formed in the dielectric layer 502 and the source/drain layer 500. The trench is etched in accordance with an applied trench mask to form the main bodies 23, 25, of the source 18, and drain 20.

Figure 14:
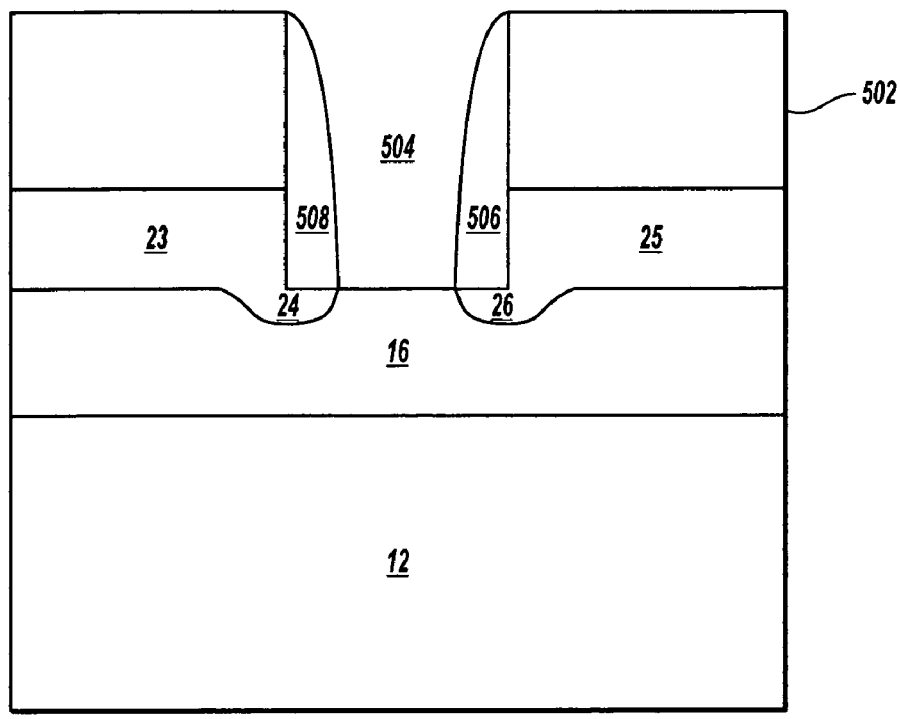
FIG. 14 is a cross-sectional view of the device of FIG. 13 device after formation of doped sidewalls.

Referring to FIG. 14, a solid source doping technique is used to form the source and drain extensions 24, 26. A layer of a heavily doped solid is formed within the trench 504 and then etched to provide doped sidewalls 506. The doped sidewalls 506 act as a source to infuse a dopant to the SOI layer 16. The regions of the SOI layer 16 proximate to the sidewalls 506 become the N+ source and drain extensions 24, 26. In an alternative technique, the extensions 24, 26 may be formed by conventional ion implantation.

Figure 15:
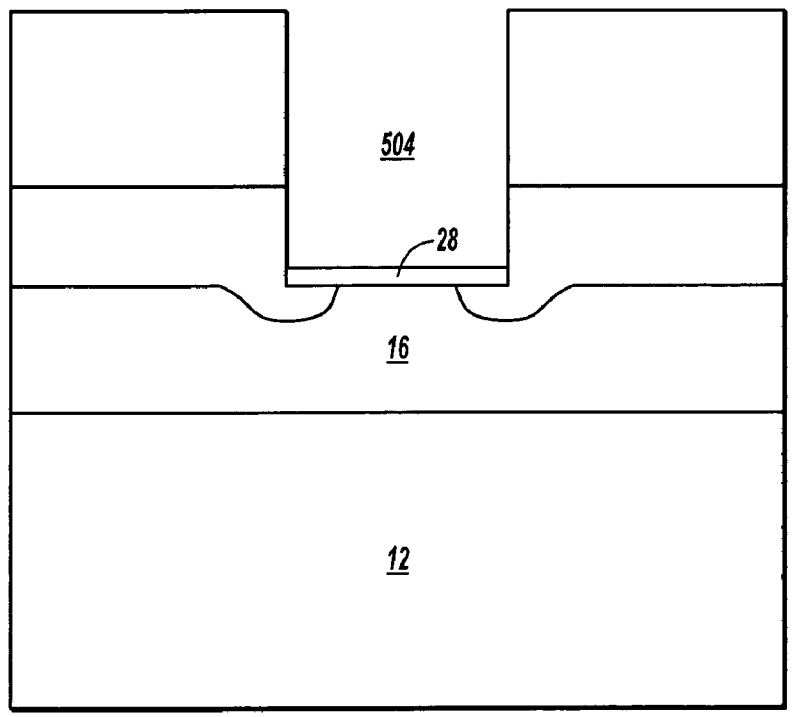
FIG. 15 is a cross-sectional view of the device of FIG. 14 after removal of the doped sidewalls and formation of a gate dielectric insulator.

Referring to FIG. 15, the doped sidewalls 506 are removed. A dielectric layer is formed within the trench 504 and etched to form a gate dielectric insulator 28 on the trench bottom.

Figure 16:
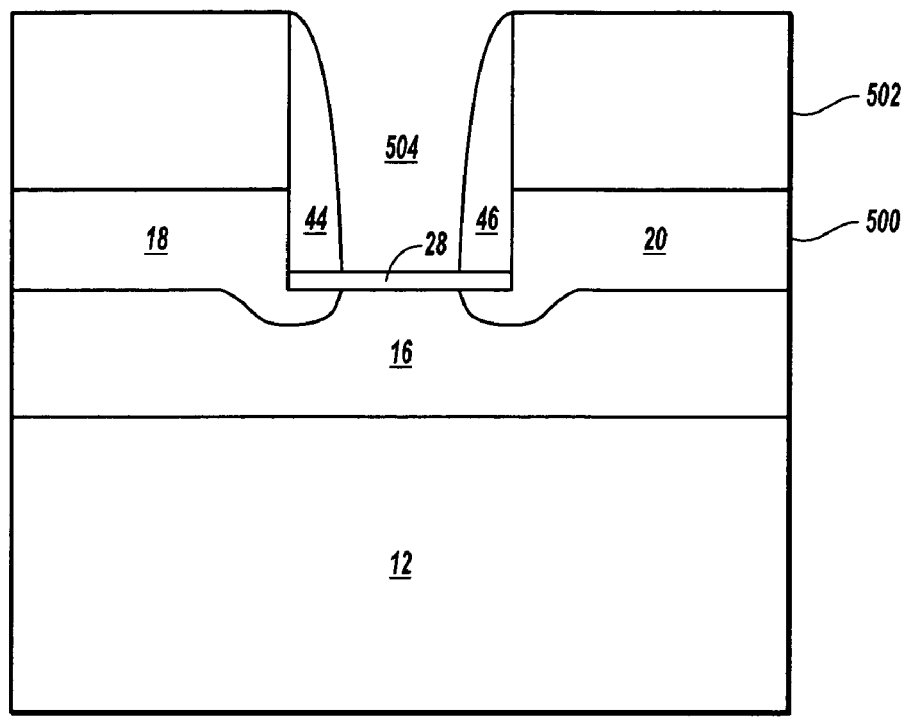
FIG. 16 is a cross-sectional view of the device of FIG. 15 after formation of spacers.

Referring to FIG. 16, a layer of silicon nitride is formed within the trench 504 and etched to form first and second spacers 44, 46.

Figure 17:
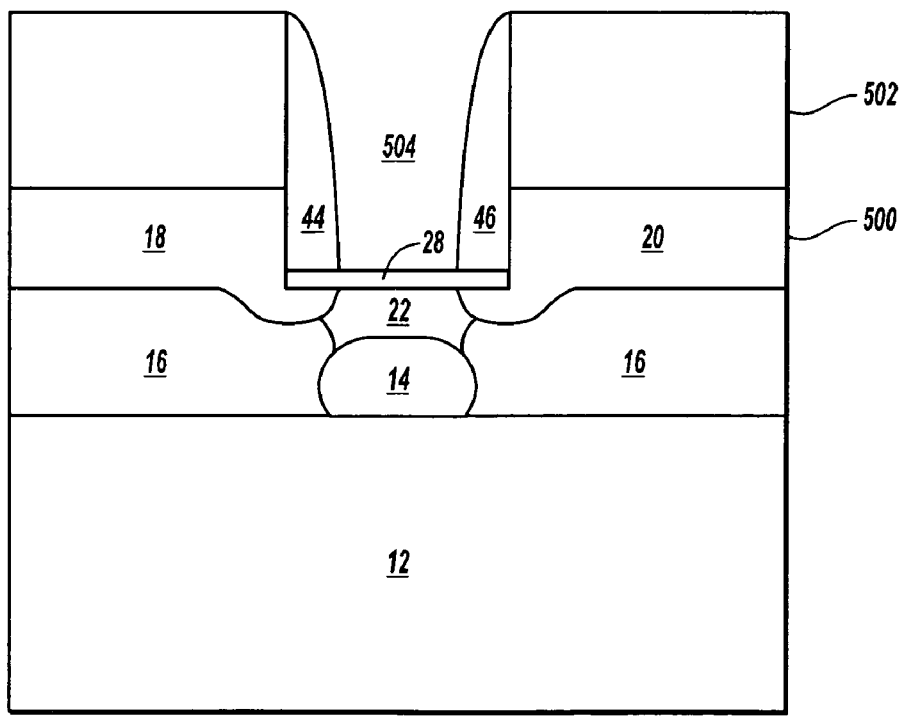
FIG. 17 is a cross-sectional view of the device of FIG. 16 after formation of a bottom gate.

In FIG. 17, the SOI layer 16 is doped with high level ion implants to form a P+ bottom gate 14. The ion implants are directed through the trench 504 to contact the SOI layer 16 and form the bottom gate 14 in the appropriate location. A channel 22 is defined as the proximate area between the bottom gate 14, extensions 24, 26, and gate dielectric insulator 28.

Figure 18:
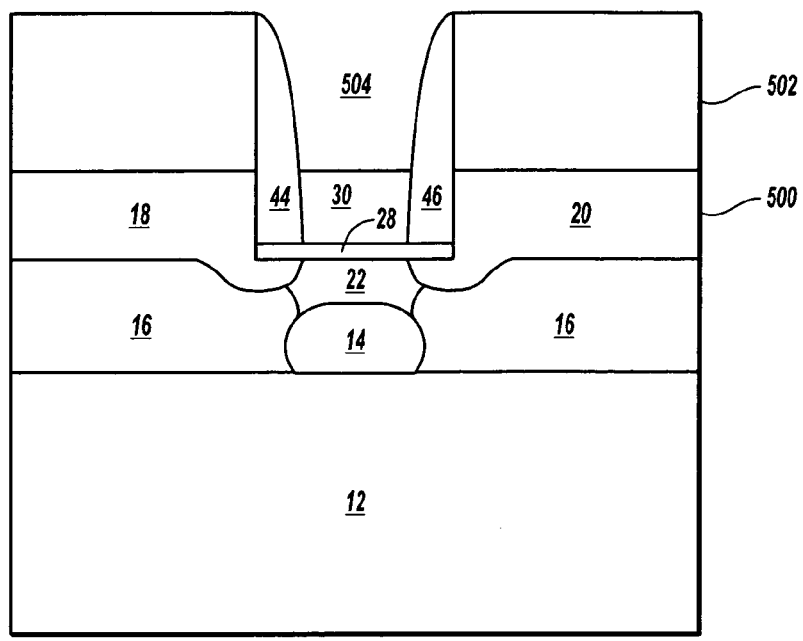
FIG. 18 is a cross-sectional view of the device of FIG. 17 after formation of a top gate.

Referring to FIG. 18, a top gate layer is deposited within the trench 504 using any number of methods such as sputtering, evaporation, pulsed laser ablation, oxidation, chemical vapor deposition, electroplating, and other techniques commonly known in the art. The top gate layer is then etched to form the top gate 30 in accordance with a top gate mask. Configuration of the top gate mask and doping of the bottom gate may be altered to manufacture alternative devices such as those shown in FIGS. 4 and 5. The top gate 30 may also be subjected to a metalization step such as the source/drain layer 500 to mobility performance.

Figure 19:
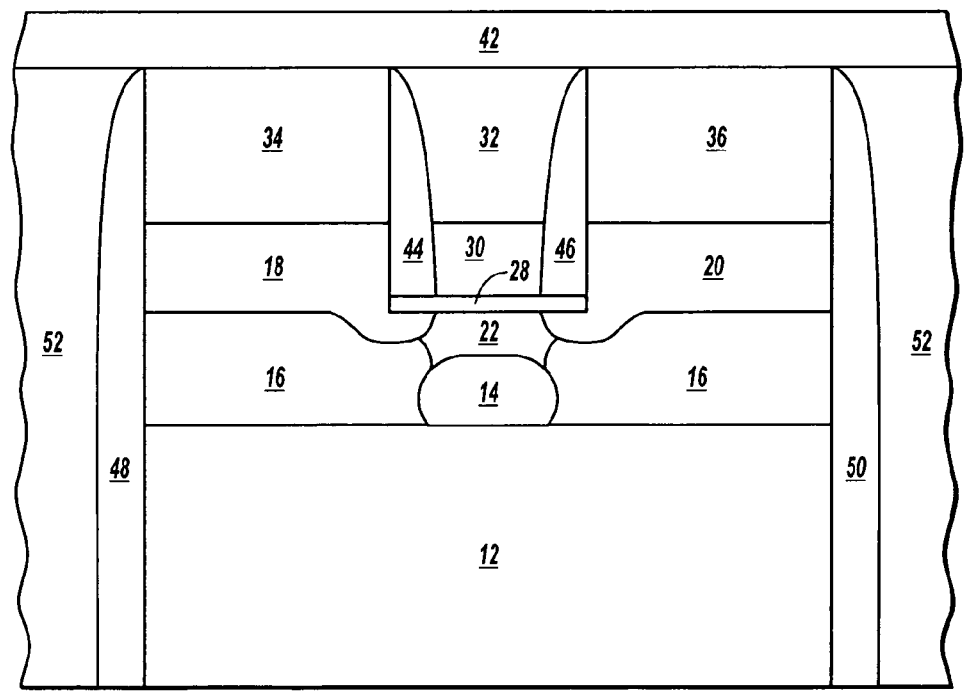
FIG. 19 is a cross-sectional view of the device of FIG. 18 after formation of a first local interconnect and an ILD layer.

Referring to FIG. 19, a conductive layer is formed within the trench 504 and planarized to form the first local interconnect 32. Although not illustrated in FIG. 19, the second local interconnect 60 is disposed adjacent the insulator 62 and in contact with the bottom gate 14 as shown in FIG. 3.

Spacers 48, 50 are formed on the perimeter of the transistor 10 to isolate the transistor 10. Formation of the spacers 48, 50 may occur simultaneously with the formation of spacers 44, 46. An STI layer 52 is formed proximate to the spacers 48, 50 to further isolate the transistor 10. Formation of the STI layer 52 may occur at any time after formation of the spacers 48, 50. An ILD layer 42 is disposed on the pads 34, 36, local interconnect 32, and STI layer 52 and then planarized.

Figure 20:
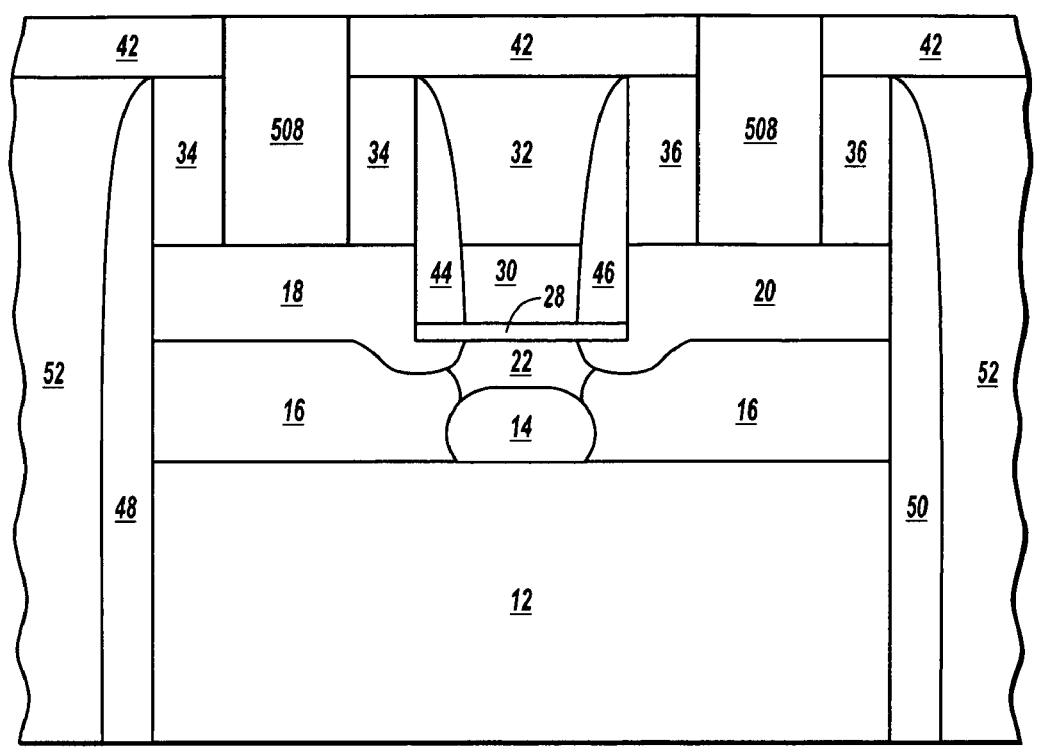
FIG. 20 is a cross-sectional view of the device of FIG. 19 after formation of contacts.

Referring to FIG. 20, a contact mask is applied to the ILD layer 42, and pads 34, 36 to form wells 508 that provide access to the source 18 and drain 20. A conductive layer is formed in the wells 508 and planarized to create contact layers 38, 40.

Similar techniques may be employed to manufacture the embodiments shown in FIGS. 9 to 11. Variances in deposition and etching techniques as well as variances in materials used may be employed and are within the scope of the invention.

A further advantage of the present invention is its inherent radiation hardness. To limit radiation sensitivity, the pads 34, 36, exterior spacers 48, 50, 68, 70, and dielectric layer 16 may all be embodied as a nitride. The exterior spacer 48, 50, 68, 70 surround the transistor components. With the addition of the pads, 34, 36, the transistor 10 is encapsulated within nitride to provide a buffer against radiation. Radiation will tend to accumulate within an oxide such as in a buried oxide of the substrate 12. The source 18 and drain 20 are separated from the substrate 12 by the dielectric layer 16 to limit the effect of accumulated radiation. Remaining radiation effects may be compensated by dynamic control of the bottom gate 14.

The present invention provides a unique transistor architecture that greatly improves gate control of the channel. The improved gate control is achieved in various embodiments by providing extensions to distance the source and drain, spacers to insulate against the source and drain, and increased channel length. The resulting electron flow path has high mobility and high current drive. The transistor architecture is flexible and may be configured with different terminal connections for different electrical behavior. In one embodiment, the present invention provides a double-gated transistor with independent gate control.

It will be obvious to those having skill in the art that many changes may be made to the details of the above-described embodiments without departing from the underlying principles of the invention. The scope of the present invention should, therefore, be determined only by the following claims.

What is claimed is:

1. A field effect transistor, comprising:
   a substrate;
   a bottom gate disposed on the substrate;
   a dielectric disposed on the substrate;
   a channel having a cross-sectional U-shape disposed above the bottom gate;
   a source disposed on the dielectric and having a source extension extending from a main body of the source and coupled to the channel;
   a drain disposed on the dielectric and having a drain extension extending from a main body of the drain and coupled to the channel;
   a gate insulator disposed on the channel;
   a top gate disposed on the gate insulator;
   a first insulating spacer disposed between the top gate and the source and proximate to the source extension; and
   a second insulating spacer disposed between the top gate and the drain and proximate to the drain extension.

2. The transistor of claim 1, wherein the gate insulator has a cross-sectional U-shape.

3. The transistor of claim 1, further comprising:
   a first local interconnect coupled to the top gate; and
   a second local interconnect insulated from the first local interconnect and coupled to the bottom gate to provide independent bias to the bottom gate.

4. The transistor of claim 1, further comprising a local interconnect coupled to the top gate and insulated from the bottom gate.

5. The transistor of claim 1, further comprising a local interconnect coupled to the top gate and coupled to the bottom gate.

6. The transistor of claim 1, wherein the channel is undoped.

7. The transistor of claim 1, wherein the main body of the source and drain is vertically disposed higher than the channel.

8. A method for manufacturing a field effect transistor, comprising:
   providing a substrate;
   forming a bottom gate on the substrate;
   providing a dielectric layer disposed on the substrate;
   forming a channel having a cross-sectional U-shape above the bottom gate;
   providing a source and drain on the dielectric layer, wherein the source includes a main body and a source extension extending from the main body and coupling to the channel, and the drain includes a main body and a drain extension extending from the main body and coupling to the channel;
   forming a gate insulator on the channel;
   forming a top gate on the gate insulator;
   forming a first insulating spacer between the top gate and the source and proximate to the source extension; and
   forming a second insulating spacer between the top gate and the drain and proximate to the drain extension.

9. The method of claim 8, wherein the gate insulator is U-shape.

10. The method of claim 8, further comprising:
    forming a first local interconnect coupled to the top gate; and
    forming a second local interconnect insulated from the first local interconnect and coupled to the bottom gate to provide independent bias to the bottom gate.

11. The method of claim 8, further comprising forming a local interconnect coupled to the top gate and insulated from the bottom gate.

12. The method of claim 8, further comprising forming a local interconnect coupled to the top gate and insulated from the bottom gate.

13. The method of claim 8, wherein the main body of the source and drain is vertically disposed higher than the channel.

14. The method of claim 8, wherein forming the source and drain includes doping a silicon material to form an N+ region defining the source and drain.

15. A field effect transistor, comprising:
    a substrate;
    a bottom gate disposed on the substrate;
    a dielectric disposed on the substrate;
    a channel having a cross-sectional U-shape disposed above the bottom gate;
    a source disposed on the dielectric and having a source extension extending from a main body of the source and coupled to the channel;
    a drain disposed on the dielectric and having a drain extension extending from a main body of the drain and coupled to the channel;
    a gate dielectric insulator disposed on the channel;
    a top gate disposed on the gate dielectric insulator;
    a first insulating spacer disposed between the top gate and the source and proximate to the source extension;
    a second insulating spacer disposed between the top gate and the drain and proximate to the drain extension;
    a local interconnect disposed on the top gate and between the first and second spacers;
    a first pad disposed on the source;
    a second pad disposed on the drain;
    a first contact extending through the first pad and coupled to the source; and
    a second contact extending through the second pad and coupled to the drain.

16. The transistor of claim 15, wherein the gate dielectric insulator has a cross-sectional U-shape.

17. The transistor of claim 15, further comprising a second local interconnect insulated from the first local interconnect and coupled to the bottom gate to provide independent bias to the bottom gate.

18. The transistor of claim 15 wherein the local interconnect is insulated from the bottom gate.

19. The transistor of claim 15, wherein the local interconnect is coupled to the bottom gate.

20. The transistor of claim 15, wherein the channel is undoped.

21. The transistor of claim 15, wherein the main body of the source and drain is vertically disposed higher than the channel.

22. The transistor of claim 15, further comprising a plurality of exterior spacers disposed on the substrate and proximate to the dielectric layer, source, drain, and pads.

23. The transistor of claim 22, further comprising an insulator layer disposed on the substrate and coupled to the exterior spacers.

24. The transistor of claim 15 further comprising an ILD layer disposed on the first and second pads and wherein the first and second contacts extend through the ILD layer.

25. A field effect transistor, comprising:
a substrate;
a bottom gate control means disposed on the substrate for effecting gate control;
a dielectric disposed on the substrate;
a channel means having a cross-sectional U-shape disposed above the bottom gate for providing an electron flow;
a source disposed on the dielectric and having a source extension extending from a main body of the source and coupled to the channel means;
a drain disposed on the dielectric and having a drain extension extending from a main body of the drain and coupled to the channel means;
a gate dielectric insulator disposed on the channel means;
a top gate control means disposed on the gate dielectric insulator for effecting gate control;
a first spacer disposed between the top gate control means and the source and proximate to the source extension; and
a second spacer disposed between the top gate control means and the drain and and proximate to the drain extension.

26. The transistor of claim 25, wherein the gate dielectric insulator has a cross-sectional U-shape.

27. A double-gated field effect transistor having independent gate control, comprising:
a substrate;
a bottom gate disposed on the substrate;
a dielectric disposed on the substrate;
a channel having a cross-sectional U-shape disposed above the bottom gate;
a source disposed on the dielectric and having a source extension extending from a main body of the source and coupled to the channel;
a drain disposed on the dielectric and having a drain extension extending from a main body of the drain and coupled to the channel;
a gate dielectric insulator disposed on the channel;
a top gate disposed on the gate dielectric insulator;
a first insulating spacer disposed between the top gate and the source and proximate to the source extension;
a second insulating spacer disposed between the top gate and the drain and proximate to the drain extension;
a first local interconnect coupled to the top gate and disposed between the first and second spacers; and
a second local interconnect insulated from the first local interconnect and coupled to the bottom gate to provide independent bias to the bottom gate.

28. The transistor of claim 27, wherein the gate dielectric insulator has a cross-sectional U-shape.

29. A radiation-resistant field effect transistor, comprising:
a substrate;
a bottom gate disposed on the substrate;
a nitride dielectric disposed on the substrate;
a channel disposed above the bottom gate;
a source disposed on the dielectric to prevent contact with the substrate, the source coupled to the channel;
a drain disposed on the dielectric to prevent contact with the substrate, the drain coupled to the channel;
a gate insulator disposed on the channel;
a top gate disposed on the gate insulator; and
a plurality of nitride exterior spacers disposed on the substrate and surrounding the bottom gate, dielectric, source, drain, gate insulator and top gate.

30. The field effect transistor of claim 29, further comprising:
a first nitride pad disposed on the source; and
a second nitride pad disposed on the drain.

31. The field effect transistor of claim 30, further comprising:
a first contact extending through the first nitride pad and coupled to the source; and
a second contact extending through the second nitride pad and coupled to the drain.

32. The field effect transistor of claim 29, wherein,
the source includes a source extension extending from a main body of the source and coupled to the channel;
the drain includes a drain extension extending from a main body of the drain and coupled to the channel;
a first insulating spacer disposed between the top gate and the source and proximate to the source extension; and
a second insulating spacer disposed between the top gate and the drain and proximate to the drain extension.

33. The field effect transistor of claim 29, wherein the channel has a cross-sectional U-shape.

34. The field effect transistor of claim 29, wherein the gate dielectric insulator has a cross-sectional U-shape.

35. The field effect transistor of claim 29 further comprising a local interconnect coupled to the top gate.

36. The field effect transistor of claim 35, further comprising a second local interconnect insulated from the first local interconnect and coupled to the bottom gate to provide independent bias to the bottom gate.

37. The field effect transistor of claim 35 wherein the local interconnect is insulated from the bottom gate.

38. The field effect transistor of claim 35, wherein the local interconnect is coupled to the bottom gate.

39. The field effect transistor of claim 29, wherein the channel is undoped.

* * * * *

UNITED STATES PATENT AND TRADEMARK OFFICE
CERTIFICATE OF CORRECTION

| | | |
|---|---|---|
| PATENT NO. | : 7,015,547 B2 | Page 1 of 1 |
| APPLICATION NO. | : 10/613169 | |
| DATED | : March 21, 2006 | |
| INVENTOR(S) | : Douglas R. Hackler, Sr. | |

It is certified that error appears in the above-identified patent and that said Letters Patent is hereby corrected as shown below:

Column 3, line 33 "...FIG. 1..." change to --FIG. 1,--

Column 4, lines 23-24 "...coupling to the main bodies..." change to --coupling the main bodies--

Column 5, line 2, "...material of the first. .." change to --material as the first--

Column 5, line 11 "...as a STI oxide,..." change to --as an STI oxide,--

Column 7, line 41 "...A SOI layer..." change to --An SOI layer--

Column 7, line 45 "...form a N+..." change to --form an N+--

Column 8, line 44 "...38,40." change to --38, 40.--

Column 8, line 53 "...spacer 48, 50." change to --spacers 48,50.--

Column 11, line 28 "...the drain and and proximate..." change to --the drain and proximate--

Column 12, line 16 "...gate insulator and top..." change to --gate insulator, and --

Signed and Sealed this

Second Day of January, 2007

JON W. DUDAS
*Director of the United States Patent and Trademark Office*